US008732923B2

(12) United States Patent
Inoue et al.

(10) Patent No.: US 8,732,923 B2
(45) Date of Patent: May 27, 2014

(54) METHOD FOR MANUFACTURING ACOUSTIC WAVE DEVICE

(75) Inventors: Kazunori Inoue, Tokyo (JP); Tsutomu Miyashita, Tokyo (JP); Kazuhiro Matsumoto, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 90 days.

(21) Appl. No.: 13/480,253

(22) Filed: May 24, 2012

(65) Prior Publication Data

US 2012/0297595 A1    Nov. 29, 2012

(30) Foreign Application Priority Data

May 25, 2011    (JP) .................................. 2011-116552

(51) Int. Cl.
*H01L 41/22*    (2013.01)
(52) U.S. Cl.
USPC .......... 29/25.35; 29/25.41; 29/592.1; 29/729; 156/235; 156/230; 156/60; 156/250; 156/260; 156/263; 156/247; 156/248; 156/249; 156/252; 438/464
(58) Field of Classification Search
USPC ........... 29/25.35, 25.41, 592.1, 729; 156/235, 156/230, 60, 250, 260, 263, 247, 248, 249, 156/252, 253; 438/464
See application file for complete search history.

(56) References Cited

U.S. PATENT DOCUMENTS

| 4,959,008 | A * | 9/1990 | Wasulko ...................... 428/40.7 |
| 7,602,262 | B2 * | 10/2009 | Inoue et al. ................... 333/133 |
| 7,875,530 | B2 * | 1/2011 | Tamura et al. ................ 438/458 |
| 7,880,316 | B2 * | 2/2011 | Ootake et al. ................. 257/783 |
| 7,891,395 | B2 * | 2/2011 | Wild et al. .................... 156/354 |
| 8,283,208 | B2 * | 10/2012 | Koyanagi ...................... 438/109 |
| 2006/0177954 | A1 * | 8/2006 | Jeong et al. .................... 438/33 |
| 2008/0018414 | A1 | 1/2008 | Inoue et al. |
| 2008/0122314 | A1 * | 5/2008 | Yamashita et al. ........ 310/313 R |
| 2010/0240196 | A1 * | 9/2010 | Saito et al. .................... 438/464 |

FOREIGN PATENT DOCUMENTS

| JP | 09-326447 A | 12/1997 |
| JP | 2008-028842 A | 2/2008 |
| JP | 2008-227748 A | 9/2008 |

* cited by examiner

*Primary Examiner* — A. Dexter Tugbang
*Assistant Examiner* — Azm Parvez
(74) *Attorney, Agent, or Firm* — Chen Yoshimura LLP

(57) ABSTRACT

A method for manufacturing an acoustic wave device includes: adhering wafer-shaped first and second piezoelectric substrates to a front face of a first and second adhesive sheet respectively and dividing the first and the second piezoelectric substrates into rectangles; adhering a third and fourth adhesive sheet to the first and second piezoelectric substrates respectively and moving at least one divided portions of the first and second piezoelectric substrates selectively to the third and fourth adhesive sheet respectively; moving the first piezoelectric substrate on the first adhesive sheet to the fourth adhesive sheet; and moving the second piezoelectric substrate on the second adhesive sheet to the third adhesive sheet.

8 Claims, 14 Drawing Sheets

FIG. 3A
FIG. 3B
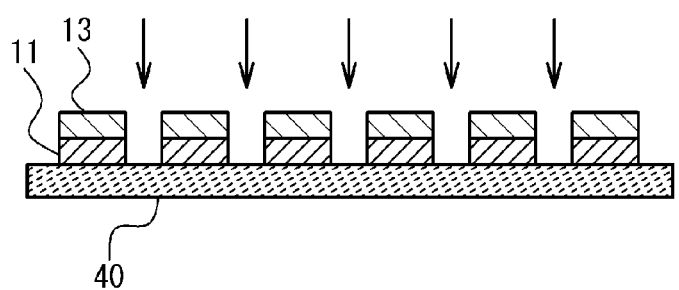
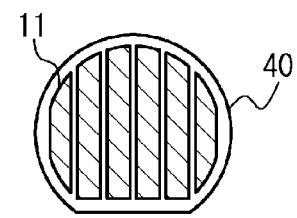

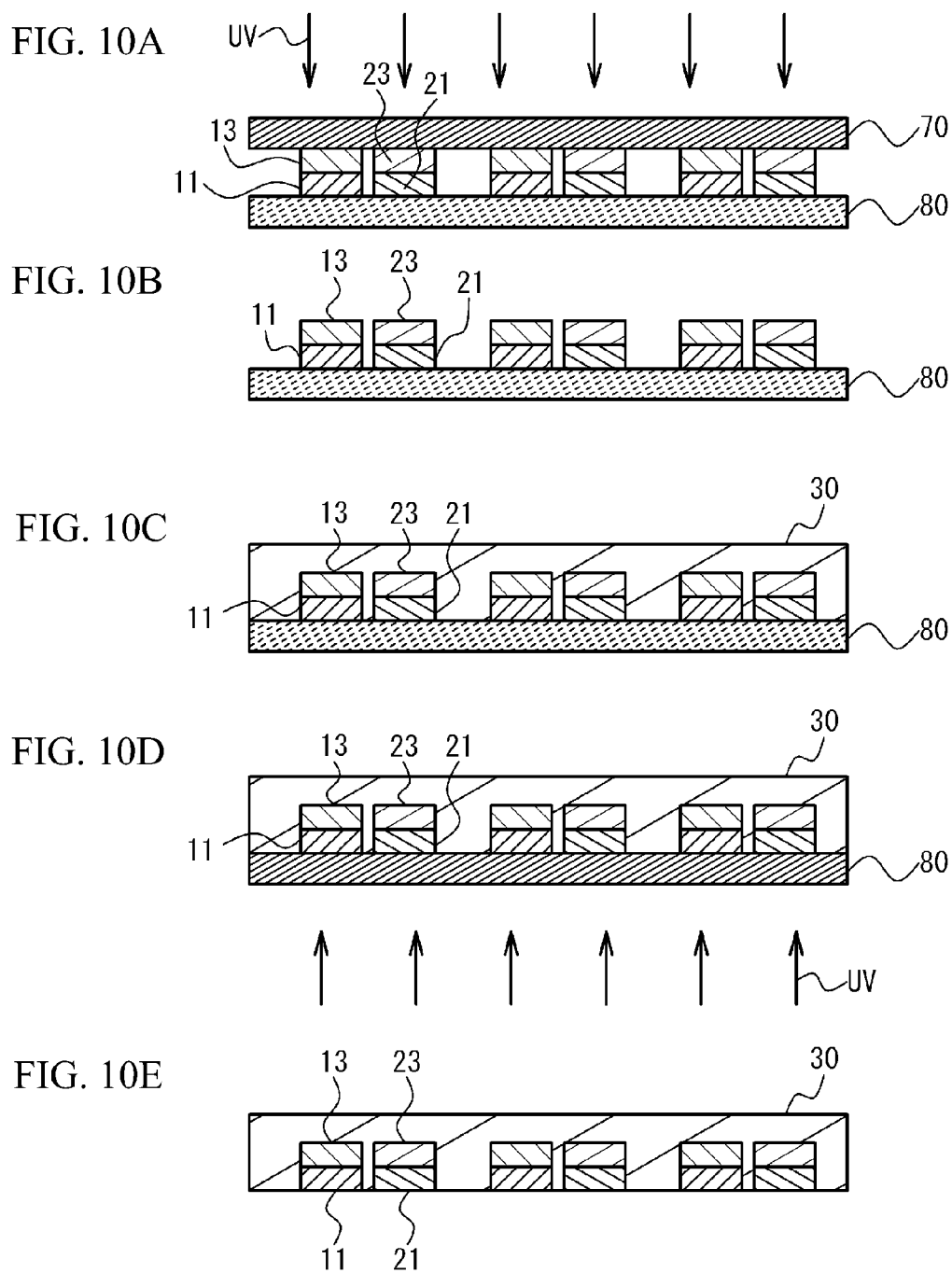

METHOD FOR MANUFACTURING ACOUSTIC WAVE DEVICE

CROSS-REFERENCE TO RELATED APPLICATION

This application is based upon and claims the benefit of priority of the prior Japanese Patent Application No. 2011-116552, filed on May 25, 2011, the entire contents of which are incorporated herein by reference.

FIELD

A certain aspect of the present invention relates to a method for manufacturing an acoustic wave device.

BACKGROUND

An acoustic wave device is used for a filter, a duplexer or the like in a mobile communication terminal. The acoustic wave device is a Surface acoustic wave (SAW) resonator using a surface acoustic wave, a boundary acoustic wave resonator using a boundary acoustic wave, a film bulk acoustic wave resonator (FBAR) using a piezoelectric thin membrane or the like. Japanese Patent Application Publication No. 2008-227748 and Japanese Patent Application Publication No. 9-326447 disclose a technology sealing a piezoelectric substrate, on which an acoustic wave device is provided, with a sealing member made of a resin or the like as a method for protecting an acoustic wave device. And the documents disclose a wafer level package structure having a hollow structure for securing a functional region (a region for exciting an acoustic wave) in an acoustic wave device.

Japanese Patent Application Publication No. 2008-227748 discloses that piezoelectric substrates (chips) having an acoustic wave device having different filter characteristics are sealed with an identical sealing resin and are integrated, in a duplexer, a dual filter or the like structured with a plurality of acoustic wave filters. There is a method for dicing a wafer into chips, arraying the chips and integrating the chips by an interposer or the like, as a method for integrating different chips.

When a wafer is divided into chips by dicing and the chips are arrayed as a method of manufacturing an acoustic wave device including a plurality of acoustic wave filters, there is a problem that a manufacturing cost is increased if a device is miniaturized. And, there is little merit on forming a wafer level package having a hollow space, because an interposer forms a hollow space on a piezoelectric substrate.

SUMMARY OF THE INVENTION

According to an aspect of the present invention, there is provided a method for manufacturing an acoustic wave device comprising: adhering a wafer-shaped first piezoelectric substrate, on which a first acoustic wave device is provided, to a front face of a first adhesive sheet and dividing the first piezoelectric substrate into rectangles; adhering a wafer-shaped second piezoelectric substrate, on which a second acoustic wave device is provided, to a front face of a second adhesive sheet and dividing the second piezoelectric substrate into rectangles; adhering a third adhesive sheet to the first piezoelectric substrate from an opposite side of the first adhesive sheet and moving at least one divided portions of the first piezoelectric substrate selectively to the third adhesive sheet; adhering a fourth adhesive sheet to the second piezoelectric substrate from an opposite side of the second adhesive sheet and moving at least one divided portions of the second piezoelectric substrate selectively to the fourth adhesive sheet; moving the first piezoelectric substrate on the first adhesive sheet to the fourth adhesive sheet by adhering the fourth adhesive sheet, on which the second piezoelectric substrate is adhered selectively, to a front face of the first piezoelectric substrate on the first adhesive sheet; and moving the second piezoelectric substrate on the second adhesive sheet to the third adhesive sheet by adhering the third adhesive sheet, on which the first piezoelectric substrate is adhered selectively, to a front face of the second acoustic wave device on the second adhesive sheet.

BRIEF DESCRIPTION OF THE DRAWINGS

FIG. 3A and FIG. 3B illustrate a method for manufacturing the acoustic wave device in accordance with the first embodiment;

FIG. 10A through FIG. 10E illustrate a method for manufacturing the acoustic wave device in accordance with the first embodiment;

DETAILED DESCRIPTION

A description is now be given of embodiments with reference to the accompanying drawings.

First Embodiment

Figure 1:
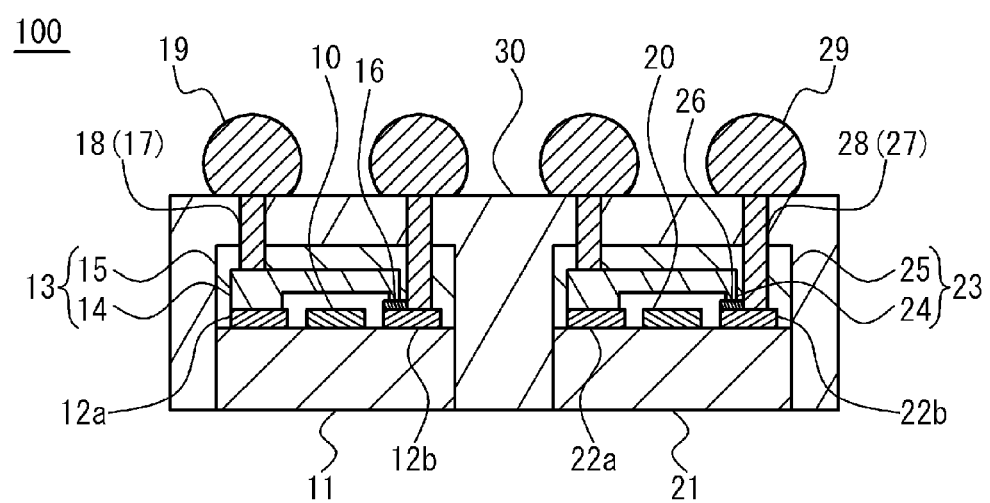
FIG. 1 illustrates a schematic cross sectional view of an acoustic wave device in accordance with a first embodiment.

FIG. 1 illustrates a schematic cross sectional view of an acoustic wave device in accordance with a first embodiment. An acoustic wave device 100 has a structure in which a first piezoelectric substrate 11 and a second piezoelectric substrate 21 are sealed with sealing members 13 and 23 and a sealing resin 30. A first acoustic wave device 10 is provided on an upper face of the first piezoelectric substrate 11. A second acoustic wave device 20 is provided on an upper face of the second piezoelectric substrate 21. $LaTiO_3$ or the like may be used as the first piezoelectric substrate 11 and the second piezoelectric substrate 21.

The first acoustic wave device 10 and wiring layers 12a and 12b coupled to the first acoustic wave device 10 are provided on the upper face of the first piezoelectric substrate 11. The upper face of the first piezoelectric substrate 11 is covered with the sealing member 13. The sealing member 13 includes a metal layer 14 and a resin layer 15. The metal layer 14 covers an upper portion of the first acoustic wave device 10 so that a hollow space is formed above the first acoustic wave device 10. When the metal layer 14 acts as a ground electrode of the first acoustic wave device 10, an edge of the metal layer 14 is coupled to the wiring layer 12a on the side of the ground. An insulating membrane 16 insulates the metal layer 14 from the wiring layer 12b on the side of signal inputting. The resin layer 15 covers a whole of the metal layer 14. The sealing member 13 including the resin layer 15 and the metal layer 14 forms a wafer level package structure having a hollow space in the first piezoelectric substrate 11.

The second acoustic wave device 20 and wiring layers 22a and 22b are provided on the second piezoelectric substrate 21, in common with the first piezoelectric substrate 11. The sealing member 23 including a metal layer 24 and a resin layer 25 covers the second acoustic wave device 20 and the wiring layers 22a and 22b. And, another wafer level package having a hollow space is formed.

The first piezoelectric substrate 11 and the second piezoelectric substrate 21 are integrally sealed with the sealing resin 30. Thus, the first acoustic wave device 10 and the second acoustic wave device 20 having different filter characteristics may be provided in a single chip. For example, when one of the first acoustic wave device 10 and the second acoustic wave device 20 acts as a transmitting filter and the other acts as a receiving filter, a duplexer constituted of a plurality of acoustic wave filters is established.

A through hole 17 is formed in the resin layer 15 of the sealing member 13 and in the sealing resin 30. A through hole 27 is formed in the resin layer 25 of the sealing member 23 and in the sealing resin 30. A through hole electrode 18 is provided in the through hole 17. A through hole electrode 28 is provided in the through hole 27. When one of the through hole electrodes 18 is coupled to the metal layer 14 of the sealing member 13 acting as a ground, the other is coupled to the wiring layer 12b on the side of signal inputting. When one of the through hole electrodes 28 is coupled to the metal layer 24 of the sealing member 23 acting as a ground, the other is coupled to the wiring layer 22b on the side of signal inputting. Solder balls 19 and 29 for mounting are provided on the through hole electrodes 18 and 28 respectively.

As illustrated in FIG. 1, there is a method of arraying chips and integrating the chips with an interposer in order to arrange the second piezoelectric substrate 21 (the second acoustic wave device 20) adjacent to the first piezoelectric substrate 11 (the first acoustic wave device 10). However, when the chips are arrayed after dicing a wafer into the chips, there is a problem that the manufacturing cost is increased if a device is miniaturized. There is little merit on forming a wafer level package having a hollow space in advance, because an interposer forms a hollow space on a piezoelectric substrate. A description will be given of a manufacturing method of an acoustic wave device for solving the above-mentioned problem.

Figure 4:
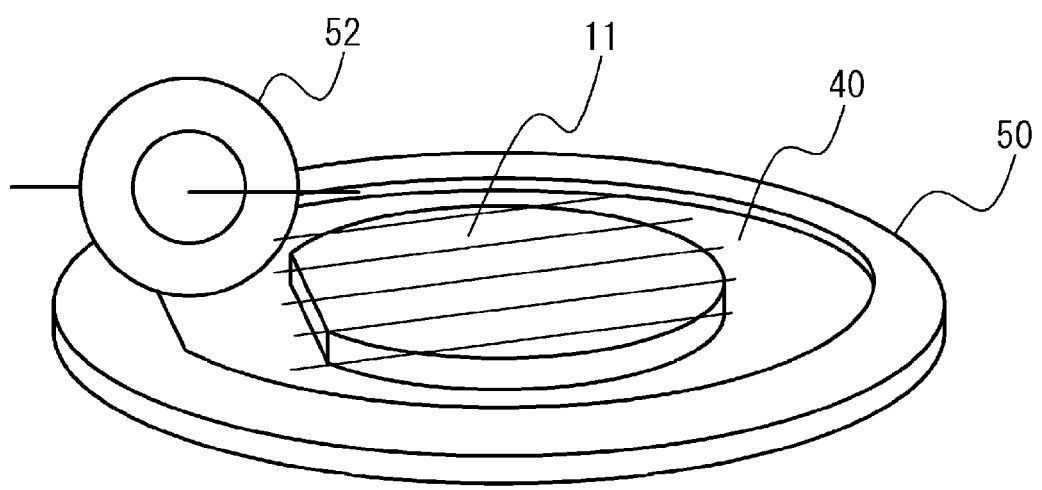
FIG. 4 illustrates a method for manufacturing the acoustic wave device in accordance with the first embodiment.
Figure 11A:
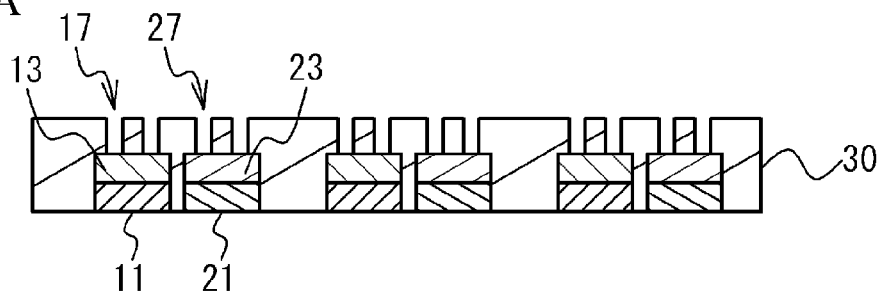
FIG. 11A through FIG. 11D illustrate a method for manufacturing the acoustic wave device in accordance with the first embodiment.
Figure 11B:
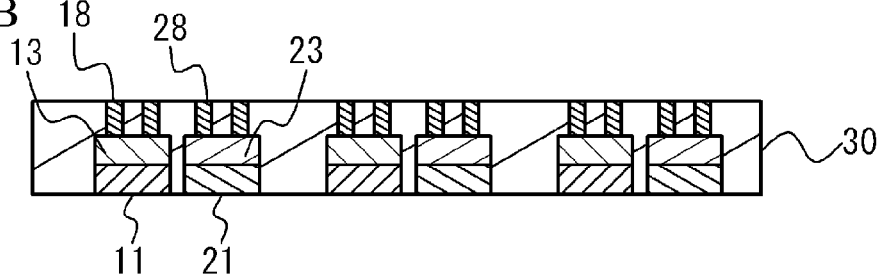
Figure 11C:
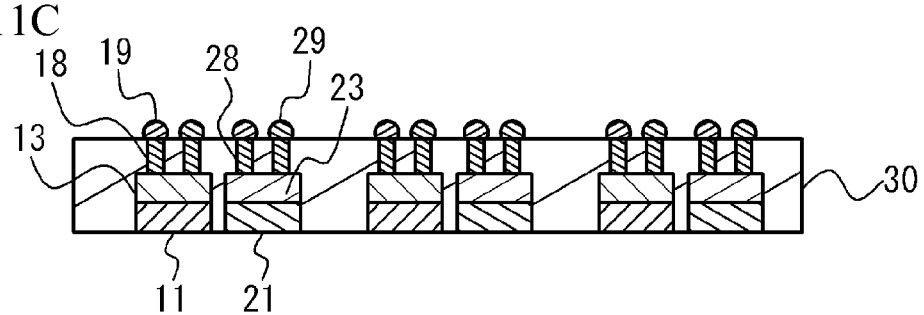
Figure 11D:
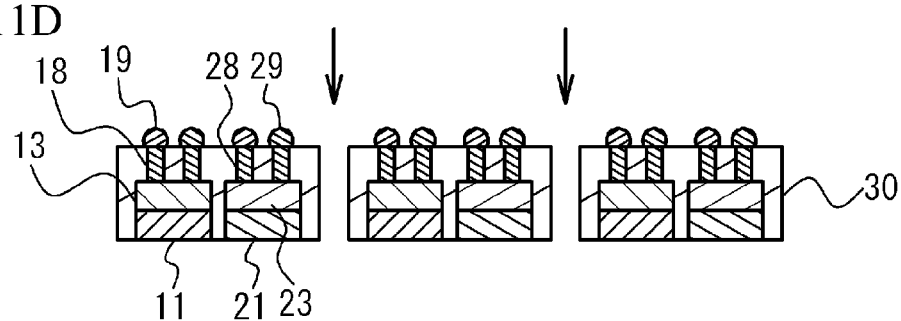
Figure 12:
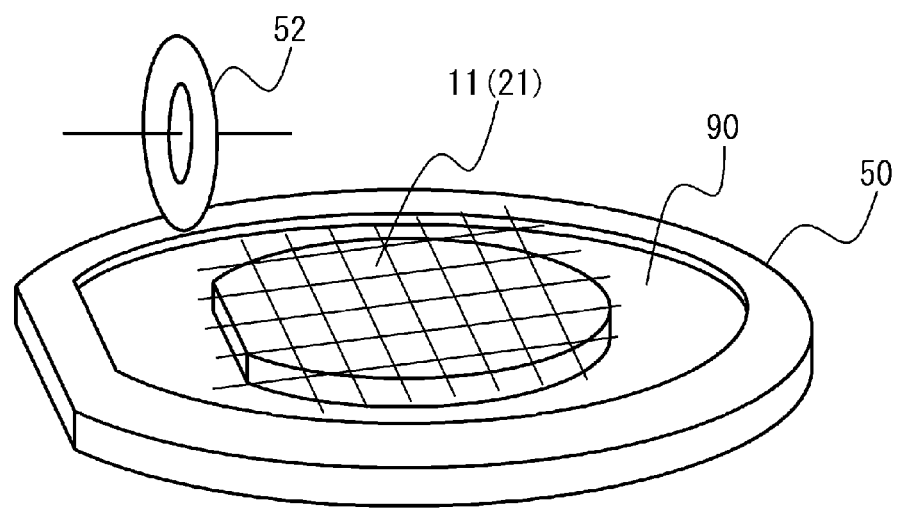
FIG. 12 illustrates a method for manufacturing the acoustic wave device in accordance with the first embodiment.

FIG. 2A through FIG. 12 illustrate a method for manufacturing the acoustic wave device in accordance with the first embodiment. FIG. 4 and FIG. 12 illustrate a perspective view of a dicing process of a wafer in the manufacturing method. The others illustrate a schematic cross sectional view of the manufacturing method. In FIG. 2B, FIG. 3B, FIG. 6B, FIG. 6C and FIG. 9B, a top view related to the cross sectional view is also illustrated. In the figures of the manufacturing method, the piezoelectric substrates 11 and 21 and the sealing members 13 and 23 are mainly illustrated. The others are omitted.

Figure 2A:
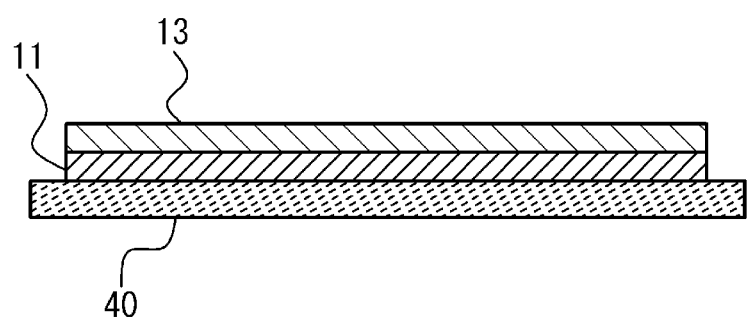
FIG. 2A and FIG. 2B illustrate a method for manufacturing the acoustic wave device in accordance with the first embodiment.
Figure 2B:
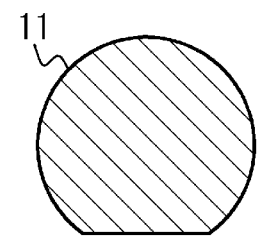

First, as illustrated in FIG. 2A and FIG. 2B, the wafer-shaped first piezoelectric substrate 11 of which upper face is sealed with the sealing member 13 is adhered to a front face of a first adhesive sheet 40 acting as a dicing tape. The first adhesive sheet 40 is an adhesive sheet of which adhesive force is reduced by ultraviolet rays. For example, a dicing tape (UV series) made by TOYO ADTEC Ltd. may be used for the first adhesive sheet 40. Next, as illustrated in FIG. 3A and FIG. 3B, the first piezoelectric substrate 11 is cut in rectangles (dicing) from the sealing member 13 side. As illustrated in FIG. 4, in the dicing process, the first adhesive sheet 40 is arranged on a ring 50 for fixing, and a rolling blade 52 is pressed to the first piezoelectric substrate 11 from above. As illustrated in FIG. 4, the wafer is subjected to the dicing from a single direction. The first piezoelectric substrate 11 is cut into parallel rectangles. Thus, the first piezoelectric substrate 11 is divided into a plurality of rectangle-shaped piezoelectric substrates.

Figure 5:
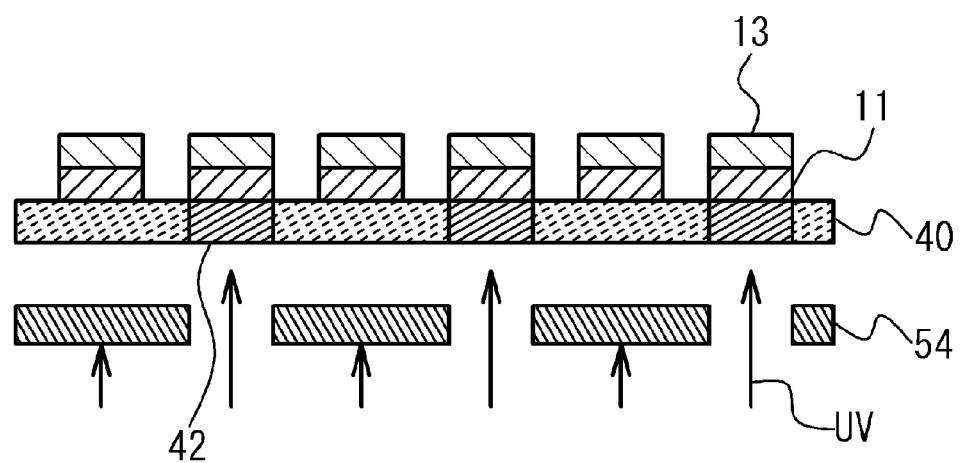
FIG. 5 illustrates a method for manufacturing the acoustic wave device in accordance with the first embodiment.

Next, as illustrated in FIG. 5, ultraviolet rays are radiated to a back face of the first adhesive sheet 40 (the opposite side of the first piezoelectric substrate 11). It is possible reduce the adhesive force of preferable areas of the first adhesive sheet 40 when the ultraviolet rays are radiated selectively through a ultraviolet-rays-shielding mask 54, because the adhesive force of the first adhesive sheet 40 is reduced by the ultraviolet rays. A number "42" is added to areas of which adhesive force is reduced.

Next, the second piezoelectric substrate 21 is subjected to the same processes as those of FIG. 2A through FIG. 5. The second acoustic wave device 20 (illustrated in FIG. 1) is provided on the upper face of the second piezoelectric substrate 21. The sealing member 13 covers the second acoustic wave device 20. The second piezoelectric substrate 21 is subjected to the dicing process after the second piezoelectric substrate 21 is adhered to a second adhesive sheet (not illustrated). And, ultraviolet rays are radiated to the back face of the second adhesive sheet selectively.

Figure 6A:
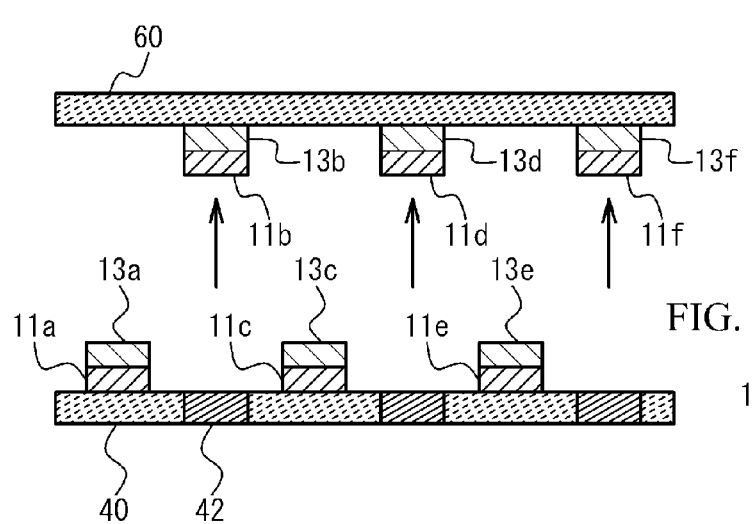
FIG. 6A through FIG. 6C illustrate a method for manufacturing the acoustic wave device in accordance with the first embodiment.
Figure 6B:
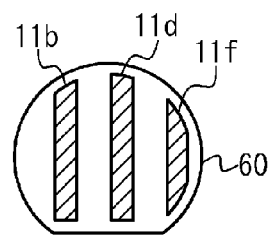
Figure 6C:
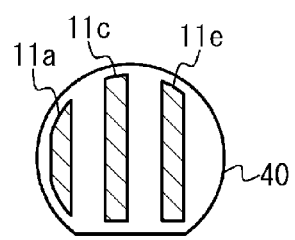

Next, as illustrated in FIG. 6A, the front face of the first adhesive sheet 40 (the first piezoelectric substrate 11 side) is pressed to a third adhesive sheet 60. Thus, the first piezoelectric substrates 11b, 11d and 11f, of which adhesive force is reduced, included in the first piezoelectric substrates 11a through 11f move to the third adhesive sheet 60. The first piezoelectric substrates 11a, 11c and 11e of which adhesive force is not reduced remain on the first adhesive sheet 40. FIG. 6B illustrates a top view of the third adhesive sheet 60 after the movement. FIG. 6C illustrates a top view of the first adhesive sheet 40 after the movement.

Figure 7:
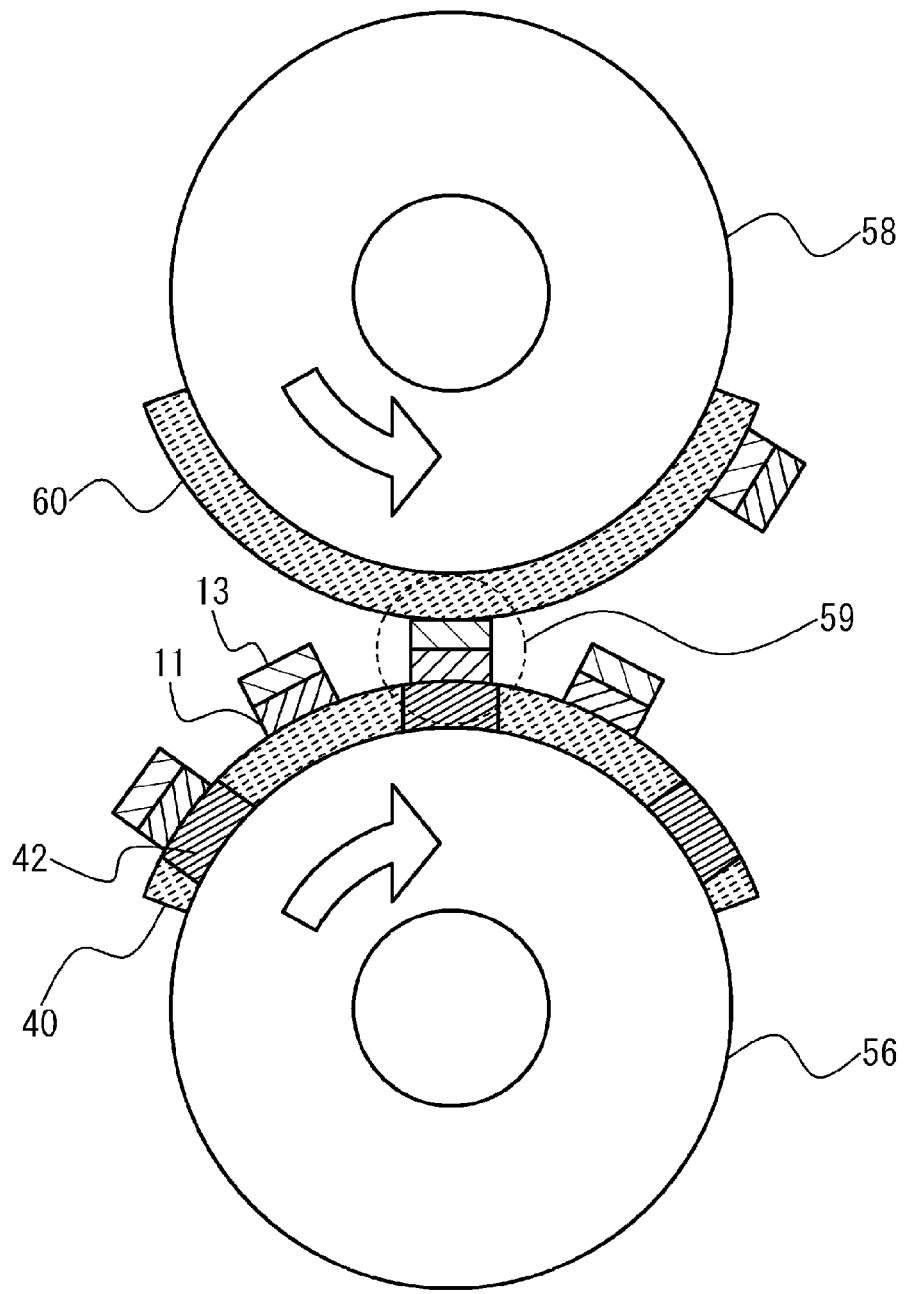
FIG. 7 illustrates a method for manufacturing the acoustic wave device in accordance with the first embodiment.

The first piezoelectric substrates 11b, 11d and 11f may move as illustrated in FIG. 7. As illustrated in FIG. 7, the first adhesive sheet 40 loops around a first roller 56, and the third adhesive sheet 60 loops around a second roller 58. There is an interval corresponding to the thickness of the first piezoelectric substrate 11 including the sealing member 13 between the first roller 56 and the second roller 58. And the first roller 56 and the second roller 58 rotate in a direction different from each other. In a region 59 between the first roller 56 and the second roller 58, the first piezoelectric substrate 11 on the first adhesive sheet 40 is contact to the third adhesive sheet 60. In this case, when the adhesive force of the first adhesive sheet 40 is reduced, the first piezoelectric substrate 11 moves to the third adhesive sheet 60 because of the adhesive force of the third adhesive sheet 60. On the other hand, when the adhesive force of the first adhesive sheet 40 is not reduced, the first piezoelectric substrate 11 does not move and remains on the first adhesive sheet 40. When the first piezoelectric substrate 11 moves to the third adhesive sheet 60 even if the adhesive force of the third adhesive sheet 60 is strong and the adhesive force of the first adhesive sheet 40 is not reduced, the first piezoelectric substrate 11 does not move and remains the first adhesive sheet 40 if a rotation axis of the first roller 56 is shifted upward and the interval of the regions 59 is enlarged when the first piezoelectric substrate 11 of which adhesive force is not reduced reaches the region 59.

Next, a second adhesive sheet (not illustrated) adhered to the second piezoelectric substrate 21 is subjected to the same processes as those of FIG. 6A through FIG. 6C and FIG. 7. That is, when a fourth adhesive sheet 70 (illustrated in FIG. 9A and FIG. 9B) is pressed to the front face of the second adhesive sheet (the second piezoelectric substrate 21 side), the second piezoelectric substrate 21 of which adhesive force with respect to the second adhesive sheet is reduced may be moved to the fourth adhesive sheet 70 selectively.

Figure 8:
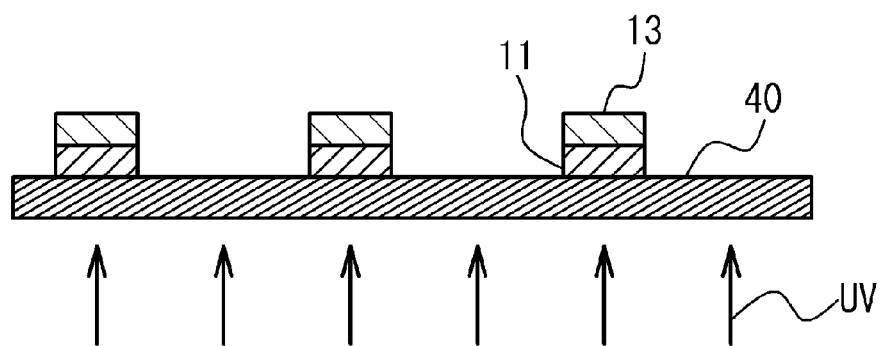
FIG. 8 illustrates a method for manufacturing the acoustic wave device in accordance with the first embodiment.

Next, as illustrated in FIG. 8, ultraviolet rays are radiated to the back face of the first adhesive sheet 40 on which some first piezoelectric substrate 11 are removed. Being different from FIG. 5, ultraviolet rays are radiated to whole face of the first adhesive sheet 40 without the ultraviolet-rays-shielding mask 54. Through the process, the adhesive force of the whole face of the first adhesive sheet 40 is reduced. The second adhesive sheet (not illustrated) of which some second piezoelectric substrate 21 are removed is subjected to the same process as FIG. 8.

Figure 9A:
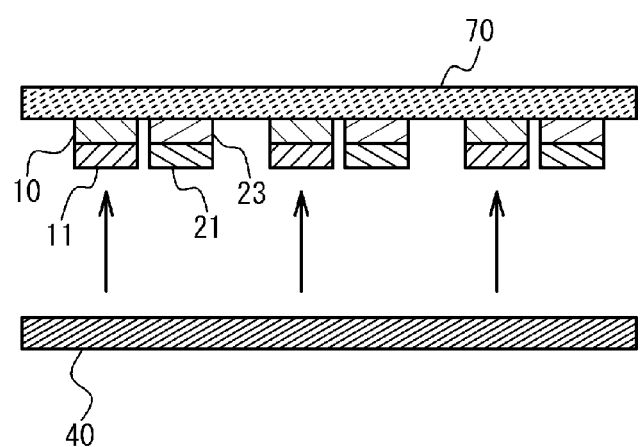
FIG. 9A and FIG. 9B illustrate a method for manufacturing the acoustic wave device in accordance with the first embodiment.

Next, as illustrated in FIG. 9A, the fourth adhesive sheet 70 is pressed to the front face of the first adhesive sheet 40. Thus, the first piezoelectric substrate 11 remaining on the first adhesive sheet 40 moves to the fourth adhesive sheet 70. The movement of the first piezoelectric substrate 11 is established through a method using a roller as well as FIG. 7. The second piezoelectric substrate 21 is adhered to the fourth adhesive sheet 70 selectively in advance through the same process as FIG. 6A through FIG. 6C. Through the movement, as illustrated in FIG. 9B, the rectangle-shaped first piezoelectric substrate 11 and the rectangle-shaped second piezoelectric substrate 21 are arrayed on the fourth adhesive sheet 70 alternately.

Figure 9B:
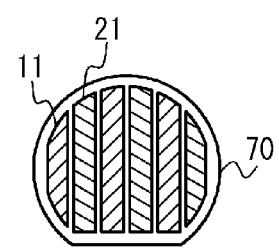

The second adhesive sheet (not illustrated) is subjected to the same process as FIG. 9A and FIG. 9B. That is, the third adhesive sheet 60 on which the first piezoelectric substrate 11 is adhered selectively in advance is pressed to the front face of the second adhesive sheet of which adhesive force is reduced. And, the second piezoelectric substrate 21 remaining on the second adhesive sheet moves to the third adhesive sheet 60. Thus, the rectangle-shaped first piezoelectric substrate 11 and the rectangle-shaped second piezoelectric substrate 21 are arrayed alternately on the third adhesive sheet 60 as well as FIG. 9B.

Next, as illustrated in FIG. 10A, the first piezoelectric substrate 11 and the second piezoelectric substrate 21 on the fourth adhesive sheet 70 are adhered to a fifth adhesive sheet 80. In the process, ultraviolet rays are radiated to the whole of the back face of the fourth adhesive sheet 70, and thereby the adhesive force of the fourth adhesive sheet 70 is reduced. The fifth adhesive sheet 80 is pressed to the first piezoelectric substrate 11 and the second piezoelectric substrate 21 from the front face side of the fourth adhesive sheet 70. And, the first piezoelectric substrate 11 and the second piezoelectric substrate 21 move to the fifth adhesive sheet 80. Thus, as illustrated in FIG. 10B, the first piezoelectric substrate 11 and the second piezoelectric substrate 21 are in contact to the fifth adhesive sheet 80.

Next, as illustrated in FIG. 10C, the first piezoelectric substrate 11 and the second piezoelectric substrate 21 are covered with the resin sheet 30 from the front face side of the fifth adhesive sheet 80. Thus, the first piezoelectric substrate 11 and the second piezoelectric substrate 21 are sealed with a resin. Next, as illustrated in FIG. 10D, ultraviolet rays are radiated to the back face of the fifth adhesive sheet 80. Thereby, the adhesive force of the fifth adhesive sheet 80 is reduced, and the fifth adhesive sheet 80 is peeled. Next, as illustrated in FIG. 10E, the resin sheet 30 is hardened by heat and is converted into the sealing resin 30. Thus, the first piezoelectric substrate 11 and the second piezoelectric substrate 21 are integrated by the sealing resin 30. The third adhesive sheet 60 is subjected to the above-mentioned processes. Thus, as illustrated in FIG. 10E, the first piezoelectric substrate 11 and the second piezoelectric substrate 21 integrated by the sealing resin 30 is provided.

Next, as illustrated in FIG. 11A, the through hole 17 is formed in the sealing resin 30 from the side of the sealing member 13 of the first piezoelectric substrate 11. And, the through hole 27 is formed in the sealing resin 30 from the side of the sealing member 23 of the second piezoelectric substrate 21. Next, as illustrated in FIG. 11B, the through hole electrodes 18 and 28 are formed in the through holes 17 and 27 respectively. After that, as illustrated in FIG. 11C, the solder balls 19 and 29 for mounting are provided on the through hole electrodes 18 and 28 respectively. After that, as illustrated in FIG. 11D, the sealing resin 30 is subjected to dicing and is divided into chips.

As illustrated in FIG. 12, in the dicing process, the first piezoelectric substrate 11 and the second piezoelectric substrate 21 integrated by the sealing resin 30 are adhered to a dicing tape 90, and the rolling blade 52 is pressed to the sealing resin 30 from above. Being different from FIG. 4, the sealing resin 30 is subjected to the dicing from two directions having a right angle with each other. The sealing resin 30 is divided into chips acting as a single device. The sealing resin 30 after the dicing includes one of the first piezoelectric substrates 11 and one of the second piezoelectric substrate 21. Through the processes, the acoustic wave device 100 illustrated in FIG. 1 is fabricated.

With the method for manufacturing the acoustic wave device in accordance with the first embodiment, a wafer including acoustic wave devices having a different characteristics is divided into rectangles. Some of the rectangles are moved to an adhesive sheet selectively. Two adhesive sheets, to which a wafer including an acoustic wave device having different characteristics are adhered, are jointed to each other. Thus, rectangle-shaped wafers are adhered to a single adhesive sheet alternately. After that, sealing with a resin, forming a through hole, forming a through hole electrode, and forming a solder ball are performed together. At last, the overall structure is subjected to dicing and is divided into each acoustic wave device. Thus, the manufacturing process is simplified, and the manufacturing cost is reduced, compared to a case where piezoelectric substrates (chips) having a wafer level package are arrayed and are integrated.

Figure 13:
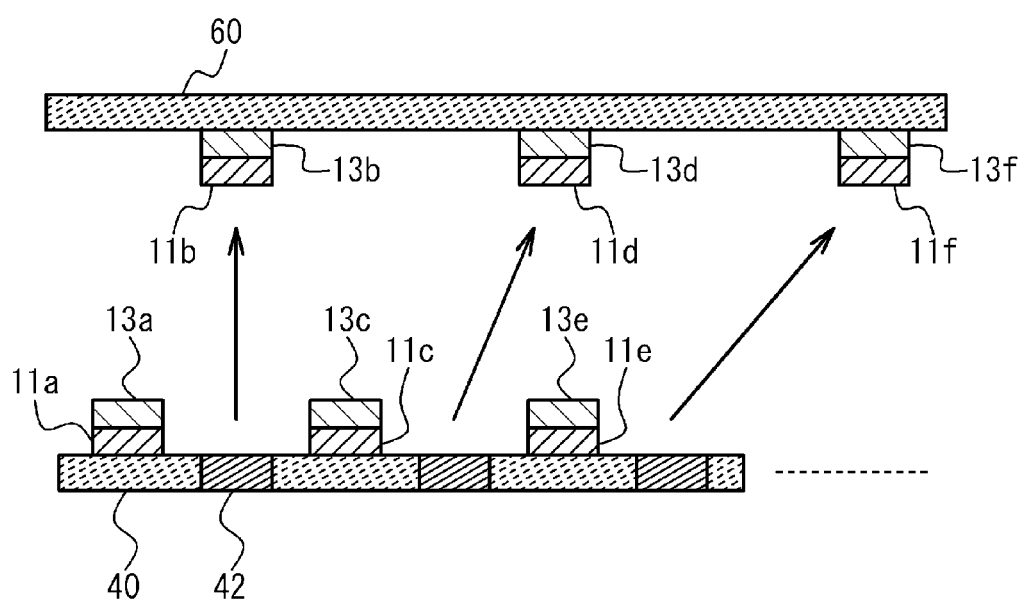
FIG. 13 illustrates a method for manufacturing the acoustic wave device in accordance with a modified embodiment.

In the first embodiment, as illustrated in FIG. 6A through FIG. 6C, a pitch of the first piezoelectric substrates 11 on the first adhesive sheet 40 is equal to that of the first piezoelectric substrates 11 on the third adhesive sheet 60. However, as illustrated in FIG. 13, the pitch of the first piezoelectric substrate 11 after the movement may be different from that before the movement. For example, the pitch can be changed easily, if the rotating speed of the two rollers is different from each other when the first piezoelectric substrate 11 are moved by the rollers illustrated in FIG. 7. There is a case where a size (width) of a device including the first piezoelectric substrate 11 is different from that of a device including the second piezoelectric substrate 21. In this case, it is easy to arrange two piezoelectric substrates having a different size adjacent to each other by adjusting a pitch of piezoelectric substrate according to that of another piezoelectric substrate, if the pitch is changeable.

Figure 14A:
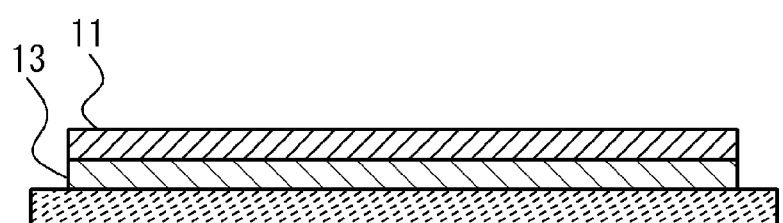
FIG. 14A and FIG. 14B illustrate a method for manufacturing the acoustic wave device in accordance with the modified embodiment.
Figure 14B:
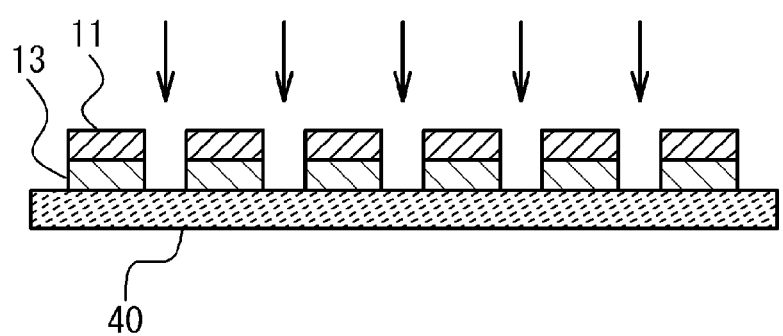

In the first embodiment, as illustrated in FIG. 3A and FIG. 3B, the dicing is performed from the side of the sealing member 13. In this case, a burr may be formed because of a resin during the dicing process. And, the burr may be adhered to a surface of an acoustic wave device because of static electricity. In this case, it is preferable that the side of the sealing member 13 is adhered to a dicing tape (the first adhesive sheet 40) as illustrated in FIG. 14A, and after that the side of the first piezoelectric substrate 11 is subjected to the dicing process as illustrated in FIG. 14B. Thus, even if a bun is formed, the formed burr is adhered to the dicing tape 40. Therefore, adhesion of the bun to the surface of the acoustic wave device is restrained. And, the number of process is reduced even if the movement from the fourth adhesive sheet 70 to the fifth adhesive sheet 80 illustrated in FIG. 10A through FIG. 10E is not performed.

In the first embodiment, a description is given of an acoustic wave device having a wafer level package having a hollow space. However, the manufacturing method is not limited to the above-mentioned acoustic wave device. However, the wafer level package having a hollow space is appropriate for the case where two types of acoustic wave devices are arrayed and integrated in the embodiment, because the thickness of whole of the device tends to be increased.

In the first embodiment, an adhesive sheet (the first adhesive sheet 40 through the fifth adhesive sheet 80) of which adhesive force is reduced by ultraviolet rays is used, in order to establish a selective movement of the rectangle-shaped piezoelectric substrates. The movement method of the piezoelectric substrate is not limited to the case. However, with the above-mentioned method, the piezoelectric substrate is moved easily.

The present invention is not limited to the specifically described embodiments, but other embodiments and variations may be made without departing from the scope of the claimed invention.

What is claimed is:

1. A method for manufacturing an acoustic wave device comprising:
    adhering a wafer-shaped first piezoelectric substrate having a first acoustic wave device thereon to a front face of a first adhesive sheet and dividing the first piezoelectric substrate into rectangles;
    adhering a wafer-shaped second piezoelectric substrate having a second acoustic wave device thereon to a front face of a second adhesive sheet and dividing the second piezoelectric substrate into rectangles;
    adhering a third adhesive sheet to the first piezoelectric substrate from an opposite side of the first adhesive sheet and moving at least one divided portions of the first piezoelectric substrate selectively to the third adhesive sheet;
    adhering a fourth adhesive sheet to the second piezoelectric substrate from an opposite side of the second adhesive sheet and moving at least one divided portions of the second piezoelectric substrate selectively to the fourth adhesive sheet;
    moving the first piezoelectric substrate on the first adhesive sheet to the fourth adhesive sheet by adhering the fourth adhesive sheet having the second piezoelectric substrate adhered selectively thereon to a front face of the first piezoelectric substrate on the first adhesive sheet; and
    moving the second piezoelectric substrate on the second adhesive sheet to the third adhesive sheet by adhering the third adhesive sheet having the first piezoelectric substrate adhered selectively thereon to a front face of the second acoustic wave device on the second adhesive sheet.

2. The method as claimed in claim 1 further comprising sealing the first piezoelectric substrate and the second piezoelectric substrate with a sealing member having a hollow space above the first acoustic wave device and the second acoustic wave device, before the dividing of the first piezoelectric substrate and the dividing of the second piezoelectric substrate.

3. The method as claimed in claim 1, wherein the moving of at least one divided portions of the first piezoelectric substrate includes adhering selected plurality of the first acoustic wave device to the third adhesive sheet at a pitch different from that on the first adhesive sheet.

4. The method as claimed in claim 1, wherein the moving of at least one divided portions of the first piezoelectric substrate is the process of adhering the first piezoelectric substrate to the third adhesive sheet by rotating a first roller and a second roller at a rotating speed different from each other,
    the first adhesive sheet looping around the first roller,
    the third adhesive sheet looping around the second roller,
    an interval corresponding to a thickness of the first piezoelectric substrate being made between the first roller and the second roller.

5. The method as claimed in claim 1, wherein:
    the first adhesive sheet, the second adhesive sheet, the third adhesive sheet and the fourth adhesive sheet are an adhesive sheet of which adhesive force is reduced by radiation of ultraviolet rays;
    the moving of at least one divided portions of the first piezoelectric substrate and the moving of the first piezoelectric substrate on the first adhesive sheet include reducing the adhesive force of the first adhesive sheet with respect to the first piezoelectric substrate by radiating ultraviolet rays to a back face of the first adhesive sheet; and
    the moving of at least one divided portions of the second piezoelectric substrate and the moving of the second piezoelectric substrate on the second adhesive sheet include reducing the adhesive force of the second adhesive sheet with respect to the second piezoelectric substrate by radiating ultraviolet rays to a back face of the second adhesive sheet.

6. The method as claimed in claim 1, wherein:
    one of the first acoustic wave device and the second acoustic wave device is a transmitting filter; and
    the other is a receiving filter.

7. The method as claimed in claim 1 further comprising:
    covering the first piezoelectric substrate and the second piezoelectric substrate with a resin sheet from an opposite side of the third adhesive sheet and the fourth adhesive sheet after the moving of the first piezoelectric substrate from the first adhesive sheet and the moving of the second piezoelectric substrate from the second adhesive sheet;
    peeling the third adhesive sheet and the fourth adhesive sheet after the covering;
    hardening the resin sheet; and
    cutting the resin sheet into chips so that each of the chips includes both of the first piezoelectric substrate and the second piezoelectric substrate.

8. The method as claimed in claim 2, wherein:
at least one of the dividing of the first piezoelectric substrate and the dividing of the second piezoelectric substrate includes: adhering the first piezoelectric substrate and/or the second piezoelectric substrate that has the sealing member to the first adhesive sheet and/or the second adhesive sheet; and
performing a dicing process to the first piezoelectric substrate and the second piezoelectric substrate from a substrate side of the first piezoelectric substrate and/or the second piezoelectric substrate.

* * * * *